United States Patent
Liu et al.

(10) Patent No.: US 7,687,794 B2
(45) Date of Patent: Mar. 30, 2010

(54) METHOD AND STRUCTURE FOR UNIFORM CONTACT AREA BETWEEN HEATER AND PHASE CHANGE MATERIAL IN PCRAM DEVICE

(75) Inventors: Shih-Chang Liu, Alian Township (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 30 days.

(21) Appl. No.: 11/781,728

(22) Filed: Jul. 23, 2007

(65) Prior Publication Data

US 2009/0026432 A1    Jan. 29, 2009

(51) Int. Cl.
*H01L 29/02* (2006.01)
(52) U.S. Cl. ........................ 257/2; 257/3; 257/4; 257/5; 257/E29.002; 438/102; 438/103; 365/163
(58) Field of Classification Search .................. 257/1–5; 438/102–103; 365/163
See application file for complete search history.

(56) References Cited

U.S. PATENT DOCUMENTS

2004/0114317 A1* 6/2004 Chiang et al. ............... 361/683
2005/0029504 A1* 2/2005 Karpov ........................... 257/4
2006/0125108 A1* 6/2006 Gutsche et al. .............. 257/774
2008/0304311 A1* 12/2008 Philipp et al. ................ 365/148
2009/0008621 A1* 1/2009 Lin et al. ......................... 257/3

OTHER PUBLICATIONS

Ahn, S.J., et al., "Highly Reliable 50nm Contact Cell Technology for 256Mb PRAM" presented at 2005 Symposium on VLSI Technology Digest of Technical Papers. Jun. 14-16, 2005 in Kyoto, Japan.

* cited by examiner

*Primary Examiner*—Thanh V Pham
*Assistant Examiner*—Jami M Valentine
(74) *Attorney, Agent, or Firm*—Duane Morris LLP

(57) ABSTRACT

A PCM (phase change memory) cell in a PCRAM (phase change random access memory) semiconductor device includes a phase change material subjacently contacted by a heater film. The phase change material is formed over a surface that is a generally planar surface with at least a downwardly extending recess. The phase change material fills the recess and contacts the upper edge of the heater film that forms the bottom of the recess. After a planar surface is initially formed, a selective etching process is used to recede the top edge of the heater film below the planar surface using a selective and isotropic etching process.

11 Claims, 11 Drawing Sheets

- PRIOR ART -

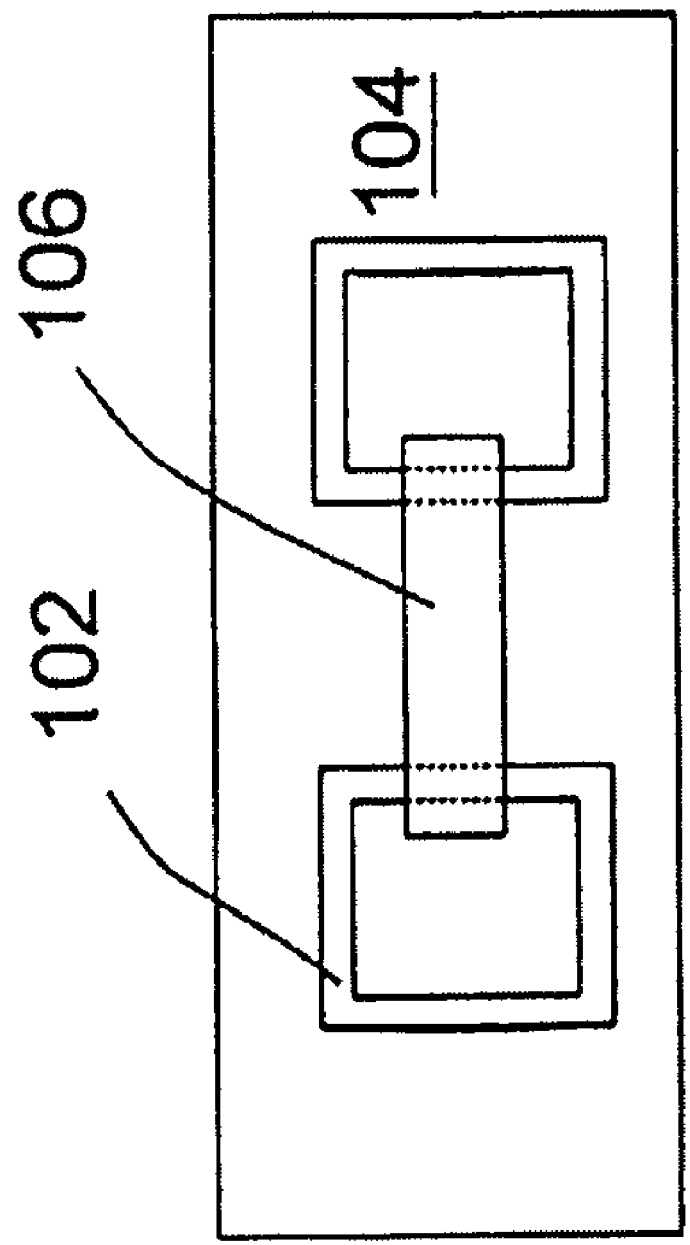

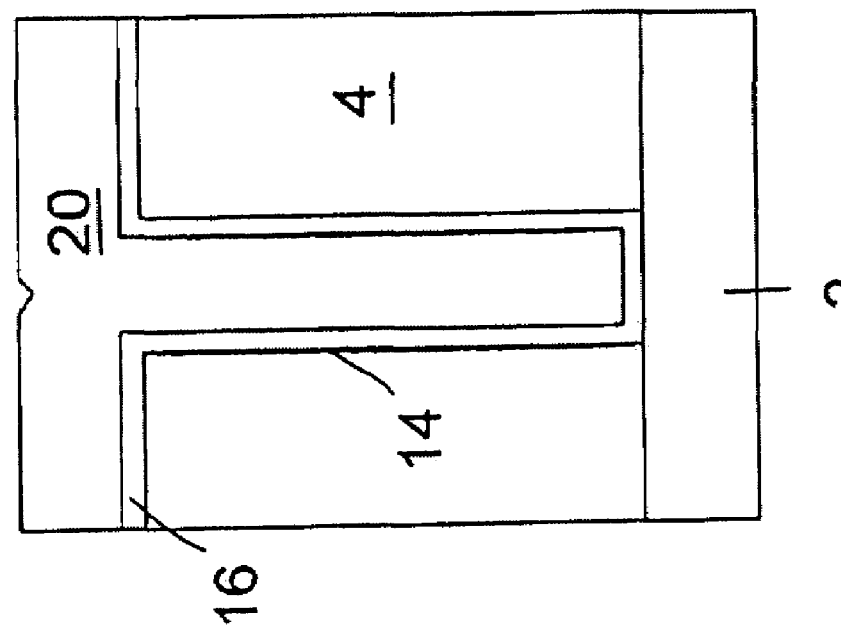

METHOD AND STRUCTURE FOR UNIFORM CONTACT AREA BETWEEN HEATER AND PHASE CHANGE MATERIAL IN PCRAM DEVICE

FIELD OF THE INVENTION

The present invention relates, most generally, to semiconductor devices and methods for forming the same. More particularly, the present invention relates to methods and structures for forming phase change memory (PCM) cells and nonvolatile memory devices such as PCRAM (phase change random access memory) devices.

BACKGROUND

With advances in electronic products, semiconductor technologies have been widely applied in manufacturing various memory devices, central processing units (CPUs), liquid crystal displays (LCDs), light emitting diodes (LEDs), laser diodes and a plethora of other devices. In order to achieve high integration levels and attain high-speed requirements, dimensions of the various features that make up semiconductor integrated circuits have been reduced and various materials such as copper and ultra low-k dielectrics, have been introduced. The incorporation of the new materials involves using new techniques that overcome manufacturing obstacles otherwise associated with the new materials. Today's rapidly progressing semiconductor manufacturing industry requires the continued development of such new materials and techniques.

Included among memory devices are volatile and nonvolatile memory devices. A volatile memory device such as a DRAM (dynamic random access memory) is provided to store data or information. A DRAM cell may include only a transistor and a capacitor. Due to its simple structure, costs for manufacturing DRAMs are low as the DRAM manufacturing process is relatively simple. When a voltage that had been applied to a DRAM is turned off, however, the data stored in the volatile DRAM cell disappears. Moreover, DRAM cells must be periodically refreshed to maintain the data stored therein because of current leakages such as from the capacitors in the DRAM cells.

Nonvolatile memory devices such as flash memory devices have been widely used as they maintain data even after input voltages have been removed. When desired, the data stored in the flash memory cells can be removed by UV radiation or electrical erasing. A flash memory cell, however, usually requires multiple gate structures for storing data and is more complex and difficult to manufacture than a DRAM cell. Therefore, the corresponding manufacturing cost for producing flash memory structures is comparatively high. Moreover, the erase/rewrite cycle of flash memory devices can be disturbed due to leakage currents from floating gates of the flash memory cell. As such, there are various shortcomings associated with nonvolatile devices such as a typical flash memory cell.

Recently, various other nonvolatile memory devices such as phase change random access memory (PCRAM) devices, magnetic random access memory (MRAM) devices and ferroelectric random access memory (FRAM) devices having cell structures more similar to those of DRAM devices, have been proposed and are being developed.

A PCM cell of a PCRAM generally includes a phase change element and a structure such as a transistor or other device that applies current to the phase change element. In one embodiment, one source/drain of the transistor may be coupled to ground with the other source/drain coupled to a phase change element and the transistor gate coupled to a gate voltage. Another portion of the phase change element may be coupled to a bit line voltage. According to this embodiment, when the data stored within the phase change element is to be accessed, a voltage is applied to turn on the transistor and the bit line voltage is applied to the phase change material such that a read current may flow through the phase change element and the transistor. Based on the level of output current, the data stored within the phase change element is accessed.

Using the aforementioned arrangement or other arrangements, the level of output current depends upon the phase and impedance of the phase change material. By changing the phase of a phase change material such as from amorphous to crystalline or vice versa, the impedance of the phase change material may dramatically change. The changing impedance of the phase change material enables the phase change material to store different data. For example, the low-impedance form of the phase change material may store a data value of "1" whereas the high impedance form of the phase change material may store a data value of "0."

Based on the foregoing, PCM structures and methods for incorporating the same into semiconductor devices are desired.

The phase of the phase change material is advantageously changed by a heater plug or other device which contacts and heats the phase change element to change the phase thereof when a set current is applied to the heater. The set and reset currents applied to change the phase of the phase change material are strongly proportional to the contact area between the heater plug and the phase change material. This is shown in FIG. 1 which is a graph showing the relationship between a reset current, in mA, and the contact area, in $nm^2$, between the heater and the phase change material. In order to be able to accurately and reliably control the phase change with a known current, it is important to reliably produce a uniform and desired contact area between the phase change materials and their associated heaters.

Based upon the foregoing, PCM cell structures with accurately produced and controlled contact areas and methods for forming the same, are desired.

SUMMARY OF THE INVENTION

To address these and other needs, and in view of its purposes, the present invention provides, in one aspect, a semiconductor device comprising a PCM (phase change memory) cell. The PCM cell comprises a phase change material layer disposed on an upper surface of a dielectric having a heater therein, the heater including an oxide core having a top surface and a heater film disposed alongside the oxide core and extending upwardly and terminating in an indentation recessed below the upper and top surfaces. A top edge of the heater film forms a bottom of the indentation. The phase change material layer is disposed on the top edge and fills the indentation, contacting the recessed top edge of the heater film.

According to another aspect, a method for forming a PCM (phase change memory) device is provided. The method comprises forming a dielectric layer over a substrate, forming an opening within the dielectric layer, the opening exposing a subjacent conductive bottom plate, depositing a heater film along sidewalls of the opening and extending to the conductive bottom plate, filling the opening with a core dielectric, planarizing to form a planar surface including a top surface of the core dielectric, an upper surface of the dielectric layer and at least one upper edge of the heater film. The method also includes receding the at least one upper edge of the heater film to form a corresponding recess extending downwardly from the planar surface and depositing a phase change material over the planar surface and filling each recess. The phase change material contacts the receded upper edge of the heater film.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 2A-2C are top views showing exemplary arrangements of structures of phase change materials overlapping heater structures such as which may utilize the concepts of the invention; and FIGS. 3A-3G are cross-sectional views illustrating a sequence of processing operations according to the present invention. FIGS. 3E-3G illustrate exemplary structures of the present invention.

DETAILED DESCRIPTION

The invention is directed to forming a PCM cell for use in a PCRAM or other device. The PCM cell includes an accurately controlled recessed contact area between the heater and the phase change material of the phase change element. By accurately controlling the contact area, the set/reset current necessary to effectuate a phase change of the phase change material can be accurately determined and controlled. Alternatively, by controlling the contact area, the PCM cell can be reliably manufactured to include a prescribed set/reset current.

Figure 1:
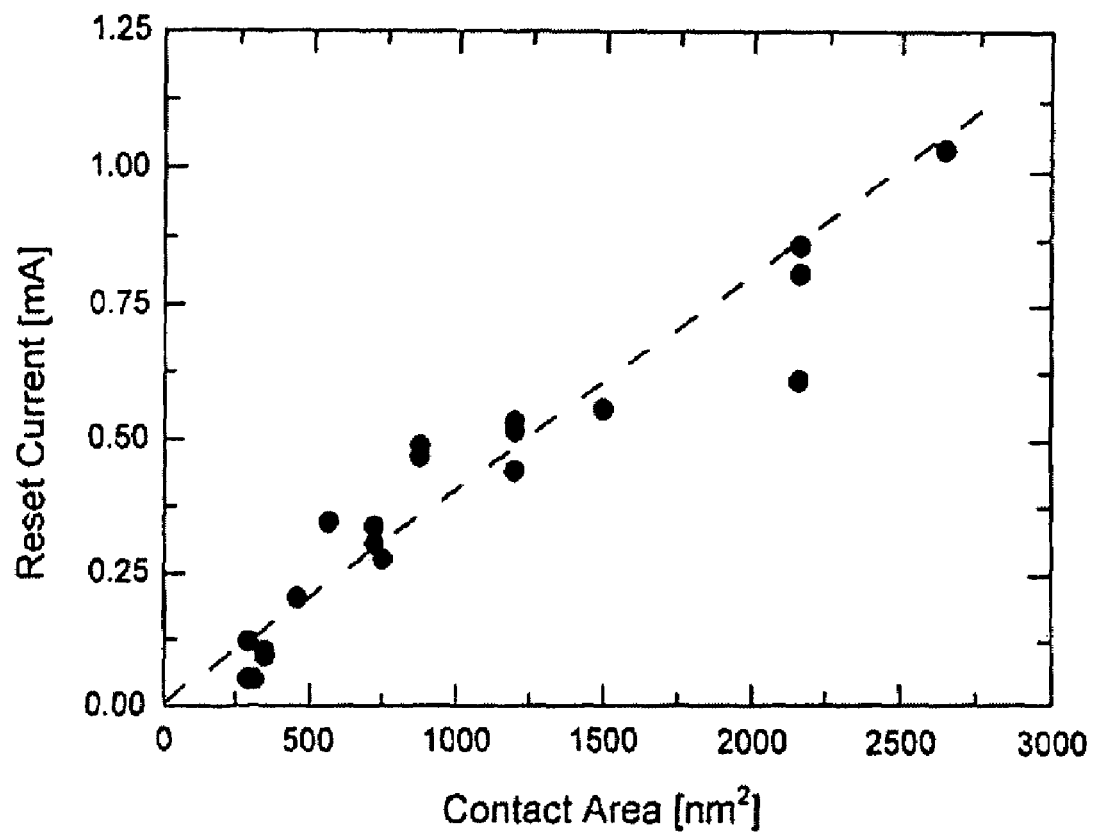
FIG. 1 is a graph showing the relationship between reset current and contact area according to the PRIOR ART.
Figure 2B:
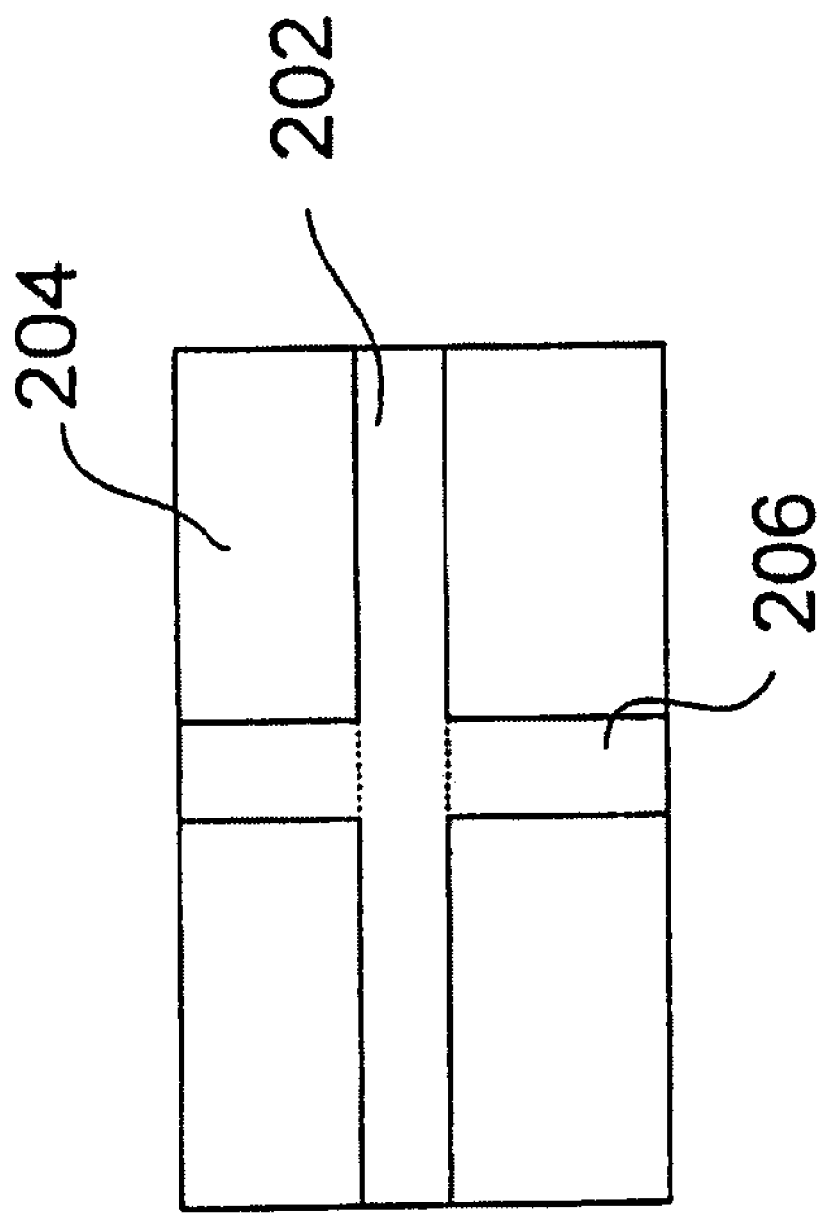
Figure 2C:
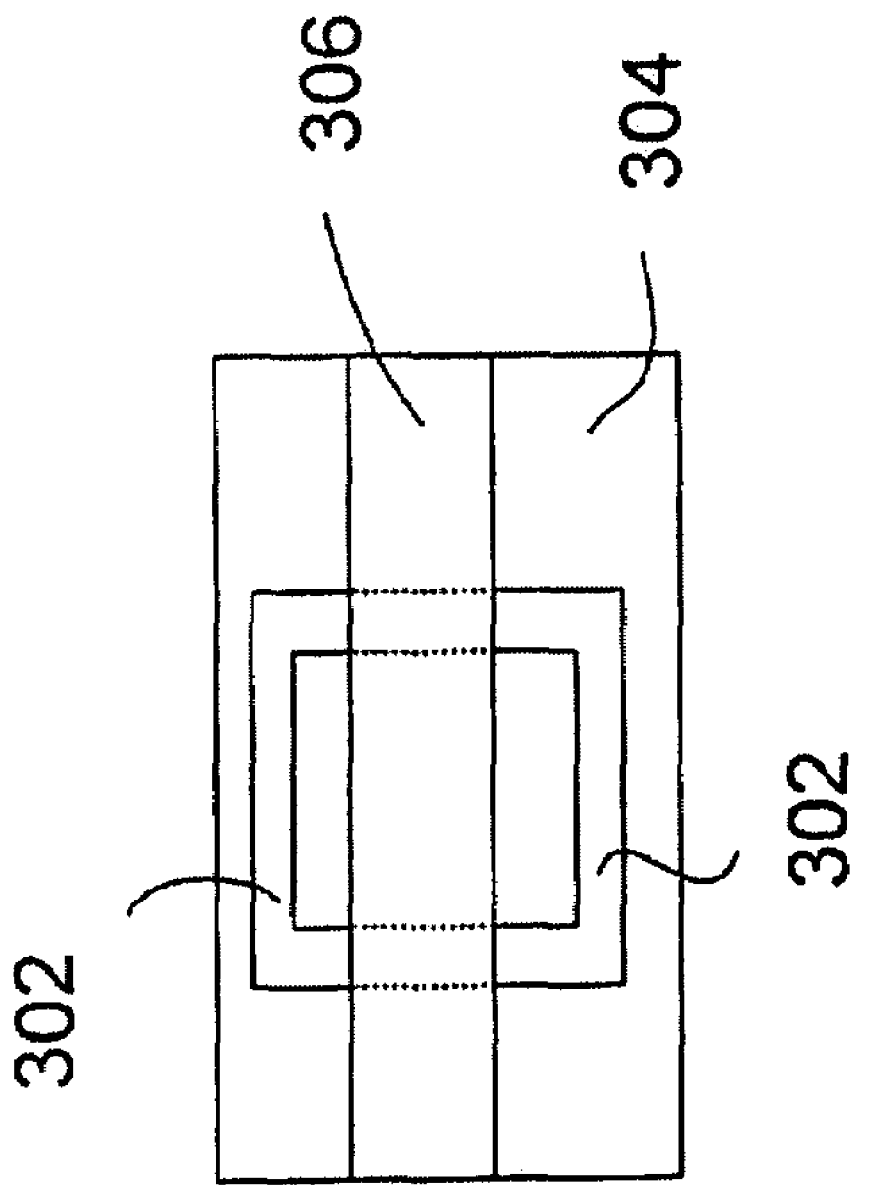

FIGS. 2A-2C are top views that show various arrangements of how a phase change material may overlie a heater structure and it should be emphasized that such structures are exemplary and not limiting of the structures that can utilize aspects of the invention. FIG. 2A shows heaters 102 formed in dielectric 104 and further shows phase change material 106 overlapping each of heaters 102. FIG. 2B shows heater 202 formed in dielectric 204 with phase change material 206 overlapping heater 202. FIG. 2C shows heater 302 having a rectangular shape and formed in dielectric 304. Phase change material 306 extends over and contacts heater 302 at two different locations.

According to conventional techniques, phase change material 106, 206, 306 is formed over a planar surface that includes coplanar upper surfaces of the dielectric materials and also includes at least one upper edge of the heater film. In the present invention, it will be seen that the phase change material 106, 206, 306 contacts an upper edge of the subjacent heater film in a recessed contact structure.

Figure 3A:
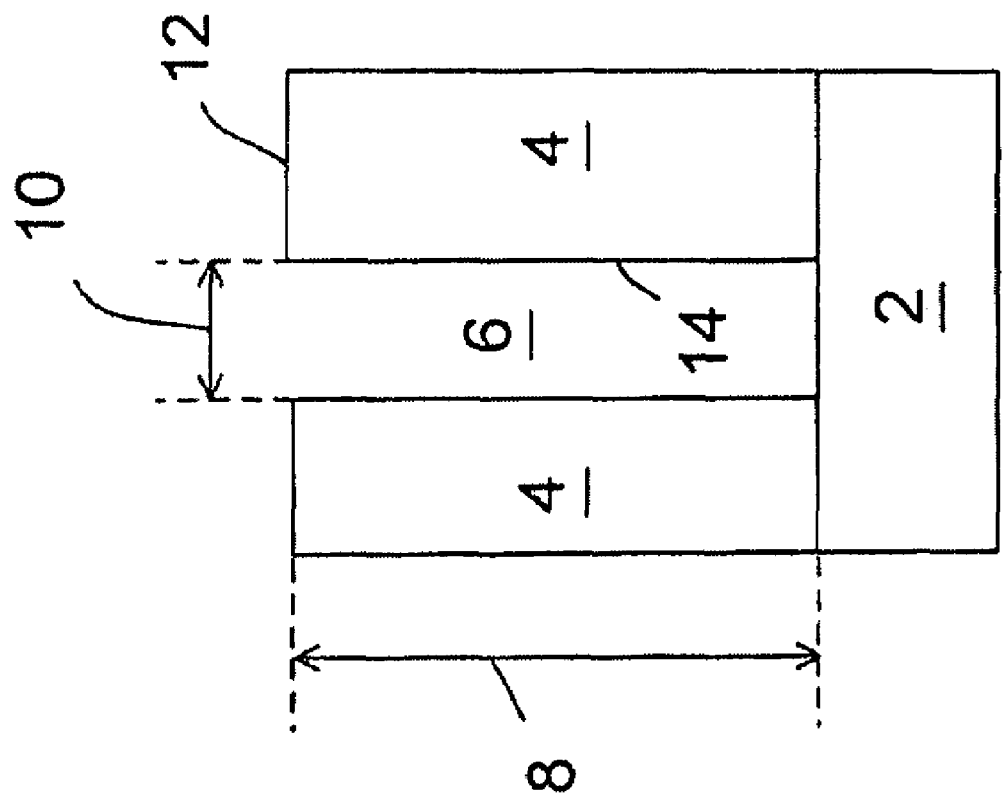

An inventive PCM cell formed according to an exemplary method of the invention is illustrated in FIGS. 3A-3G. Such a PCM cell is advantageously utilized in a PCRAM nonvolatile memory device. FIG. 3A shows dielectric 4 formed over bottom plate 2. Bottom plate 2 may be formed of any of various suitable conductive or semiconductive materials. Dielectric 4 may be $SiO_2$, other suitable oxides, low-k dielectric materials or various other suitable dielectric materials used in manufacturing semiconductor devices. Opening 6 is formed in dielectric material 4 using conventional methods such as an anisotropic plasma etching process. Opening 6 extends down to expose bottom plate 2. Opening 6 has an aspect ratio defined by height 8 and width 10 and the aspect ratio may range from 2.5:1 to 5:1 according to various exemplary embodiments. Dielectric 4 includes top surface 12 and opening 6 includes sidewalls 14. As FIG. 3A is a cross-sectional view, it should be understood that opening 6 may be a generally round or elliptical opening, a rectangular opening or a lengthy trench, when viewed from above.

Figure 3B:
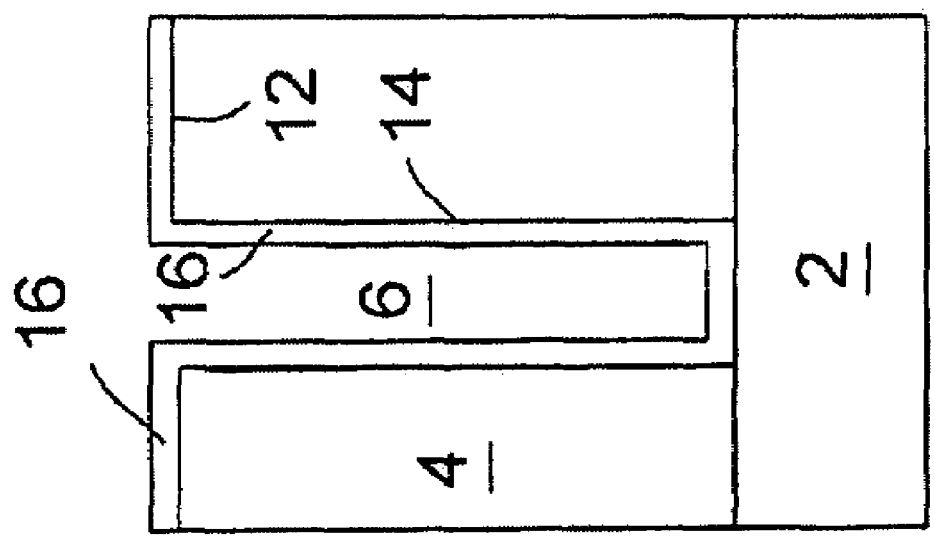

Now turning to FIG. 3B, heater film 16 is formed over top surface 12 of dielectric 4 and also within opening 6. Heater film 16 is formed along sidewalls 14 and contacts bottom plate 2 which may be a current source that applies a current to heater film 16. In one exemplary embodiment, heater film 16 may include a thickness ranging from 50-150 angstroms, but other thicknesses may be used and may be determined at least in part, by the aspect ratio of opening 6. In one exemplary embodiment, heater film 16 may be TiN, but other suitable heater film material such as TaN or TiAlN may be used.

Core dielectric 20 is then formed over the structure in FIG. 3B to produce the structure shown in FIG. 3C. Core dielectric 20 fills former opening 6 and may be an oxide such as $SiO_2$, but other suitable dielectric materials other than oxides, may also be used. Various suitable deposition techniques may be used to form core dielectric 20 such that it fills previously illustrated opening 6. Core dielectric 20 may be the same as or different than dielectric 4.

Figure 3D:
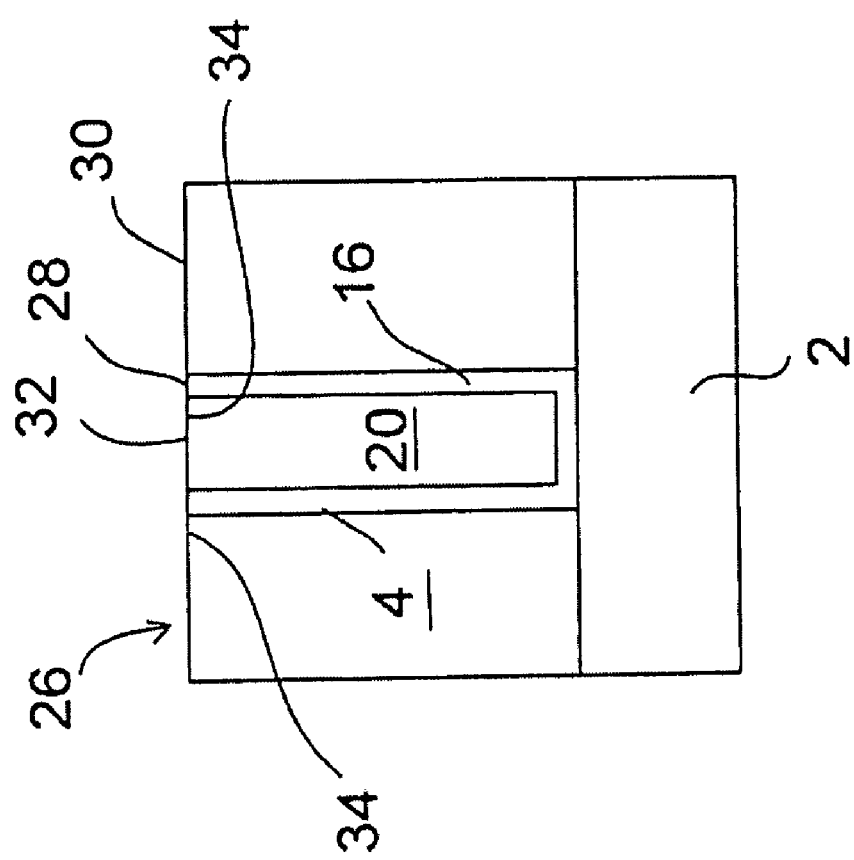

A suitable planarization technique such as chemical mechanical polishing, CMP, is performed on the structure of FIG. 3C to produce planar top surface 26 shown in FIG. 3D. Planar top surface 26 consists of the following co-planar surfaces: upper surface 30 of dielectric 4, upper surface 32 of core dielectric 20 and upper edges 28 of heater film 16.

According to conventional techniques, the planar top surface 26 shown in FIG. 3D may additionally include remnants of heater film 16 at locations other than at upper edges 28, i.e., that are proximate to upper edges 28 of heater film 16. During the planarization process, the material of heater film 16 may become distributed on top planar surface 26 in areas other than at upper edges 28. For example, areas 34 consisting of extraneous heater film material may be present. This extraneous material alters the predicted and desired contact area between the heater film 16 and a film such as a phase change material, formed thereover. Since the amount of lateral encroachment is difficult to control or predict, the contact area between heater film 16 and any film subsequently formed thereover, cannot be accurately controlled using conventional methods and structures.

Figure 3E:
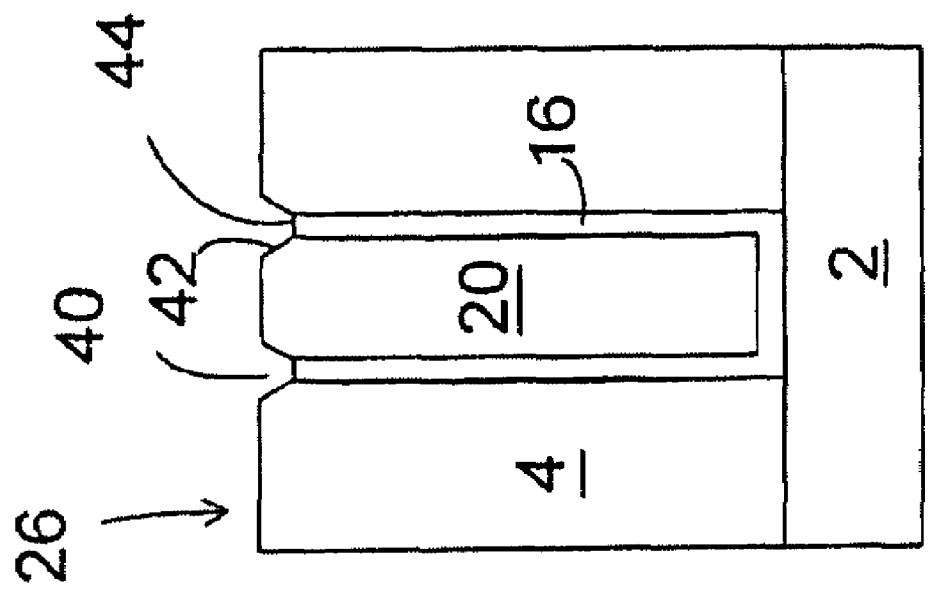

As such, prior to forming a phase change material over the structure shown in FIG. 3D, recesses or recessed indentations, are formed such as shown in FIG. 3E. Recesses 40 are formed extending downwardly from planar top surface 26 using an isotropic etching process that selectively etches phase change film 16 thereby removing any extraneous and unwanted phase change material and receding the upper edge of heater film 16 to form recessed upper edge 44 which forms the bottom of recess 40. Recesses 40 are formed between dielectric 4 and core dielectric 20. Recesses 40 may include a depth of about 100-200 angstroms, but other depths may be used in other exemplary embodiments and may depend on the dimensions of the various features. Recesses 40 are further defined by sloped sides 42, which are angled, i.e. non-orthogonal, with respect to planar top surface 26. In other words, the etching process is controlled so that previously orthogonal upper corners of dielectric 4 and core dielectric 20 such as shown in FIG. 3D, are somewhat laterally eroded as recesses 40 are formed. The etch process may include a selectivity of the heater film:dielectric materials (dielectric 4, core dielectric 20) of about 2-5:1, but other selectivities may be used in other exemplary embodiments. According to one exemplary embodiment in which each of core dielectric 20 and dielectric layer 4 is $SiO_2$, and in which heater film 16 is TiN, the etching process may be a plasma, reactive ion etch that include chlorine as the main etchant gas. $BCl_3$ and an inert gas may additionally be used and the etching conditions may include a temperature of about 75° C. or greater and a pressure within the range of about 20-50 millitorr. The etchant gas composition, temperature and pressure may vary in other exemplary embodiments and other suitable etching processes will be used for etching different materials and to produce recesses 40 with suitable slopes. Other suitable wet and dry etching processes may alternatively be used.

Figure 3F:
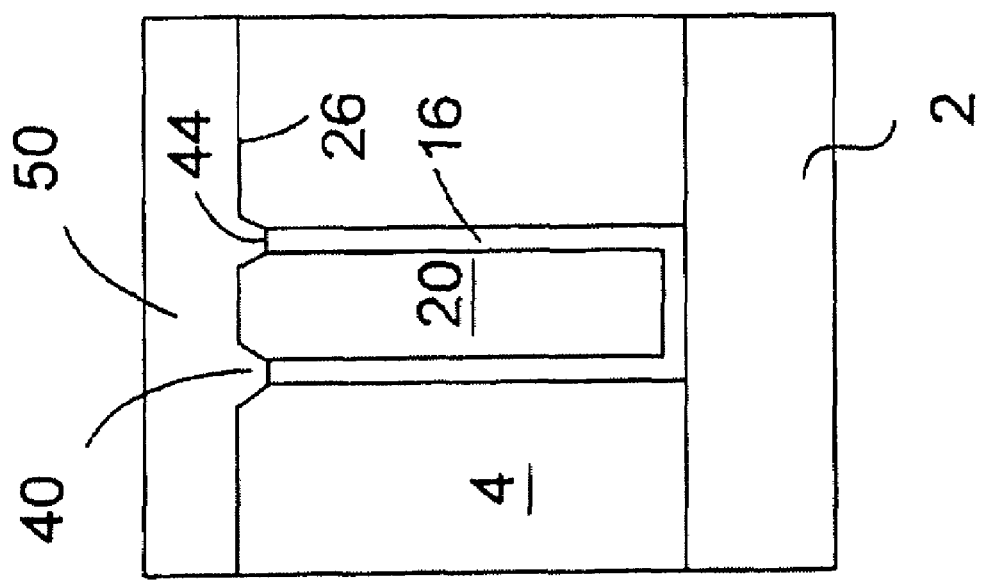

Now turning to FIG. 3F, phase change material 50 is formed over top planar surface 26 and fills recesses 40. In one advantageous embodiment, phase change material 50 may be GST, $Ge_2Sb_2Te_5$, but other phase change materials such as Ge93Sb7 may be used in other exemplary embodiments. Phase change material 50 is chosen to be a material that will undergo a phase change such as from amorphous to crystalline or vice-versa when heated by the heater in response to a sufficient current being applied to the heater. It should be noted that the exemplary arrangement illustrated in FIG. 3F in which phase change material 50 extends over two recessed upper edges 44 of a heater element that may be ring-shaped, elliptical, square, rectangular, or trench-shaped when viewed from above, is exemplary only and that the recesses formed as described herein, may be employed in other structures in which phase change material 50 is formed over a heater element including but not limited to the arrangements shown in FIGS. 2A-2C. Returning to FIG. 3F, the area of contact between phase change material 50 and heater film 16 is accurately controlled as the contact area of recessed upper edges 44 is known to be the thickness or width 52 of heater film 16 multiplied by the linear dimension of the upper edge 44 that contacts phase change material 50.

Figure 3G:
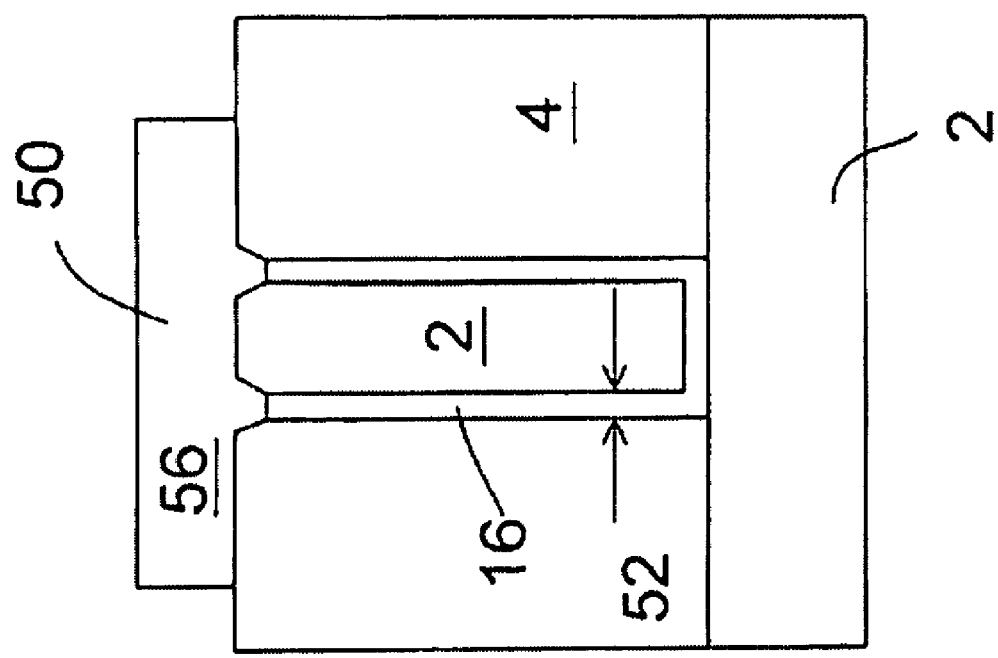

FIG. 3G shows the structure of FIG. 3F after phase change material 50 has been patterned to form patterned phase change element 56 using conventional methods. This may represent the subsequent step in the processing sequence for forming a PCM cell. Additional conventional steps may be used to provide additional electrical contact to patterned phase change element 56 such as by contacting a conductive material such as a bit line, from above and patterned phase change element 56 may already be electrically coupled to further elements upon formation. Various additional processing operations may be used to form PCM cells of various structures and configurations that may be used as non-volatile memory PCRAM (phase change random access memory) structures in the various applications and devices and circuits described above. In one embodiment of a completed device, a current may be delivered from bottom plate 2 to heater film 16 causing heater film 16 to heat patterned phase change element 56 changing the phase thereof from amorphous to crystalline or vice versa. Other arrangements to deliver current to heater film 16 and to cause heater film 16 to heat patterned phase change element 56 may be used in other embodiments.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device or structure be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising a PCM (phase change memory) cell comprising:
   a phase change material disposed on an upper surface of a dielectric having a heater therein, said heater including an oxide core having a top surface end a heater film disposed alongside and laterally surrounding said oxide core and extending upwardly and terminating in an indentation recessed below said upper and top surfaces, a top edge of said heater film forming a bottom of said indentation and said phase change material further disposed on said top edge and filling said indentation and said heater film further extending directly beneath a bottom surface of said oxide core.

2. The semiconductor device as in claim 1, wherein said top surface and said upper surface are coplanar.

3. The semiconductor device as in claim 1, further comprising a current source contacting said heater film.

4. The semiconductor device as in claim 1, wherein said indentation extends about 100-200 angstroms below said upper and top surfaces.

5. The semiconductor device as in claim 1, wherein said indentation is defined by sides that are sloped with respect to said upper surface.

6. The semiconductor device as in claim 1, wherein said phase change material comprises $Ge_2Sb_2Te_5$.

7. The semiconductor device as in claim 1, wherein said lop surface is coplanar with said upper surface and said indentation is formed between said oxide core and said dielectric, said heater film directly interposed between said oxide core and said dielectric.

8. The semiconductor device as in claim 1, wherein said heater film that further extends directly beneath said bottom surface of said oxide core, directly contacts a subjacent conductive plate.

9. The semiconductor device as in claim 1, wherein said heater changes a phase of said phase change material from amorphous to crystalline or vice versa.

10. The semiconductor device as in claim 1, wherein said heater film comprises TiN.

11. The semiconductor device as in claim 1, further comprising a bottom conductive plate disposed below said dielectric and contacting said heater film and a conductive structure overlying and contacting said phase change material.

\* \* \* \* \*

UNITED STATES PATENT AND TRADEMARK OFFICE
CERTIFICATE OF CORRECTION

PATENT NO. : 7,687,794 B2  Page 1 of 1
APPLICATION NO. : 11/781728
DATED : March 30, 2010
INVENTOR(S) : Shih-Chang Liu et al.

It is certified that error appears in the above-identified patent and that said Letters Patent is hereby corrected as shown below:

In Column 6, Claim 1, line 38, replace "end" with --and--.

In Column 6, claim 7, line 59, replace "lop" with --top--.

Signed and Sealed this

Thirtieth Day of November, 2010

David J. Kappos
*Director of the United States Patent and Trademark Office*